United States Patent
Hashida

(10) Patent No.: US 9,369,268 B2
(45) Date of Patent: Jun. 14, 2016

(54) RECEPTION CIRCUIT

(71) Applicant: FUJITSU LIMITED, Kawasaki-shi, Kanagawa (JP)

(72) Inventor: Takushi Hashida, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/687,094

(22) Filed: Apr. 15, 2015

(65) Prior Publication Data
US 2015/0326385 A1 Nov. 12, 2015

(30) Foreign Application Priority Data

May 8, 2014 (JP) ................................ 2014-096659

(51) Int. Cl.
*H04L 7/033* (2006.01)
*H04L 7/00* (2006.01)
*H03L 7/081* (2006.01)

(52) U.S. Cl.
CPC .............. *H04L 7/033* (2013.01); *H03L 7/0812* (2013.01); *H04L 7/0025* (2013.01); *H04L 7/0033* (2013.01); *H04L 7/0004* (2013.01)

(58) Field of Classification Search
CPC ....... H04L 7/0008; H04L 7/02; H04L 7/0337; H04L 7/0334; H04L 7/033; H04L 7/027; H04L 7/04; H03L 7/0896; H03L 7/087
USPC .......... 375/354–355, 359, 362, 371, 373–376
See application file for complete search history.

(56) References Cited

U.S. PATENT DOCUMENTS

| 6,041,090 A * | 3/2000 | Chen ..................... H03L 7/0891 327/148 |
| 2002/0116468 A1 | 8/2002 | Ishikawa |
| 2012/0119801 A1* | 5/2012 | Hsieh ..................... H03L 7/087 327/156 |
| 2014/0010337 A1* | 1/2014 | Staszewski .......... H03C 3/0966 375/376 |
| 2015/0092898 A1* | 4/2015 | Lee .................. G06Q 10/06312 375/354 |

FOREIGN PATENT DOCUMENTS

| JP | 2002-232404 | 8/2002 |
| JP | 2003-318872 | 11/2003 |

* cited by examiner

*Primary Examiner* — Sam K Ahn
*Assistant Examiner* — Janice Tieu
(74) *Attorney, Agent, or Firm* — Fujitsu Patent Center

(57) ABSTRACT

First and second determination units determine amplitude levels of an input data signal in synchronization with respective first and second clocks, a phase detector detects a phase relationship between the input data signal and the second clock based on the amplitude levels, and first and second phase adjusters adjust phases of the respective first and second clocks according to a detection result of the phase detector. Further, a correction unit corrects a skew generated between the first and second clocks which arrive at the first and second determination units. A correction amount determination unit determines a correction amount corresponding to the skew in the correction unit according to the detection result in the phase detector when a phase difference set between the first and second clocks is made zero.

4 Claims, 20 Drawing Sheets

| $D_{n-1}$ | $E_n$ | $D_n$ | U | D | S | N | STATE |
|---|---|---|---|---|---|---|---|
| 0 | 0 | 0 | 0 | 0 | 1 | 0 | Stay |
| 0 | 0 | 1 | 0 | 1 | 0 | 0 | Down |
| 0 | 1 | 0 | 0 | 0 | 0 | 1 | N/A |
| 0 | 1 | 1 | 1 | 0 | 0 | 0 | Up |
| 1 | 0 | 0 | 1 | 0 | 0 | 0 | Up |
| 1 | 0 | 1 | 0 | 0 | 0 | 1 | N/A |
| 1 | 1 | 0 | 0 | 1 | 0 | 0 | Down |
| 1 | 1 | 1 | 0 | 0 | 1 | 0 | Stay |

FIG. 6

RECEPTION CIRCUIT

CROSS-REFERENCE TO RELATED APPLICATION

This application is based upon and claims the benefit of priority of the prior Japanese Patent Application No. 2014-096659, filed on May 8, 2014, the entire contents of which are incorporated herein by reference.

FIELD

The embodiments discussed herein relate to a reception circuit.

BACKGROUND

Recently, along with the performance improvement of an information processing apparatus, data rate has been increased for a data signal transmitted or received within an apparatus or between apparatuses.

A reception circuit of the data signal determines an amplitude level of the data signal at timing matching a sampling clock, and regenerates data according to the determination result. When the data rate is increased, slight phase shift generated between the data signal and the sampling clock affects the accuracy of the data determination. Accordingly, there has been utilized a technique called tracking CDR (Clock and Data Recovery) which detects such phase shift and synchronizes the phase of the sampling clock with the phase of the data signal.

In the reception circuit handling the data signal having a high data rate, there is frequently used a technique called 2× tracking CDR (hereinafter, described as 2×CDR) which performs sampling twice in an interval of 1 UI (Unit Interval). 2×CDR uses a clock to match an edge with the eye center of the data signal and a clock to match the edge with a transition point (boundary) at which the amplitude level of the data signal makes a transition. In the following, the former clock is called a data clock and the latter clock is called a boundary clock. Here, the both clocks are adjusted by a phase adjustment circuit so as to have a phase difference of 0.5 UI. Thereby, when the boundary clock follows the transition point in CDR, it is possible to perform sampling (data determination) at the eye center of the data signal using the data clock.

Japanese Laid-Open Patent Publication No. 2003-318872
Japanese Laid-Open Patent Publication No. 2002-232404

The data clock and the boundary clock are input into a determination unit (comparator) which performs sampling of the data signal. At this time, a delay difference (skew) is generated until the clocks arrive at the comparator because of the difference in transmission path and load between the data clock and the boundary clock. Therefore, even if the edge of the boundary clock follows the transition point of the data signal, there is a possibility that the edge of the data clock becomes unable to locate the eye center of the data signal and the data determination accuracy is deteriorated.

SUMMARY

According to an aspect, there is provided a reception circuit including: a first determination unit configured to determine a first amplitude level of an input data signal in synchronization with a first clock; a second determination unit configured to determine a second amplitude level of the input data signal in synchronization with a second clock which has a first phase difference with respect to the first clock; a phase detector configured to detect a phase relationship between the input data signal and the second clock based on the first amplitude level and the second amplitude level; a first phase adjuster configured to adjust a phase of the first clock according to a detection result of the phase detector; a second phase adjuster configured to adjust a phase of the second clock so that the second clock follow an amplitude level transition point of the input data signal according to the detection result; a correction unit configured to correct a skew generated between the first clock and the second clock which arrive at the first determination unit and the second determination unit; and a correction amount determination unit configured to determine a correction amount corresponding to the skew in the correction unit according to the detection result when the first phase difference is set to zero.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 6 illustrates an example of a truth table realized by an arithmetic circuit;

DESCRIPTION OF EMBODIMENTS

Figure 1:
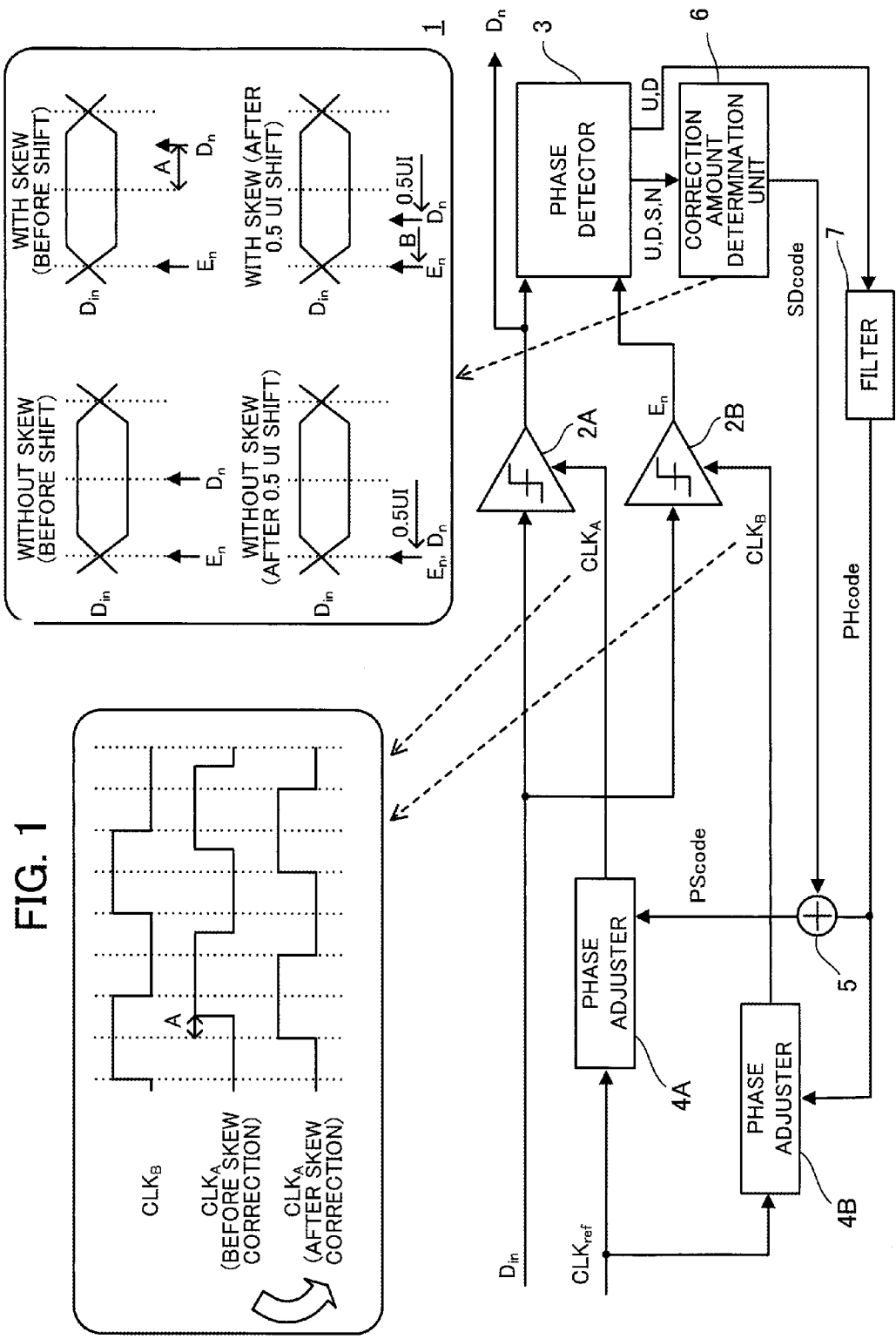
FIG. 1 illustrates an example of a reception circuit of a first embodiment.

Several embodiments will be described below with reference to the accompanying drawings, wherein like reference numerals refer to like elements throughout.

First Embodiment

FIG. 1 illustrates an example of a reception circuit of a first embodiment.

A reception circuit 1 has the function of 2×CDR. That is, the reception circuit 1 performs regeneration of a clock and data using a data clock for locating the eye center of an input data signal $D_{in}$ which is input from the outside and a boundary clock for locating an amplitude level transition point of the input data signal $D_{in}$ as sampling clocks. In the following, the data clock is described as a clock $CLK_A$ and the boundary is described as a clock $CLK_B$.

The reception circuit 1 includes determination units 2A and 2B, a phase detector 3, phase adjusters 4A and 4B, a correction unit 5, a correction amount determination unit 6, and a filter 7.

The determination unit 2A determines the amplitude level of the input data signal $D_{in}$ in synchronization with the clock $CLK_A$. The determination unit 2A is a comparator, for example, and compares the input data signal $D_{in}$ with a predetermined threshold value at the edge position of the clock $CLK_A$ (e.g., rising edge or falling edge) to determine the amplitude level (0/1), and outputs a determination result $D_n$. Here, the determination result $D_n$ becomes the data to be regenerated by 2×CDR. Further, the determination unit 2A may be provided in plurality.

The determination unit 2B determines the amplitude level of the input data signal $D_{in}$ in synchronization with the clock $CLK_B$ which has a predetermined phase difference with respect to the clock $CLK_A$. The determination unit 2B is a comparator, for example, and compares the input data signal $D_{in}$ with a predetermined threshold value at the edge position of the clock $CLK_B$ to determine the amplitude level (0/1), and outputs a determination result $E_n$. The predetermined phase difference is a phase difference of 0.5 UI. When a skew does not exist and the clock $CLK_B$ follows an amplitude level transition point of the input data signal $D_{in}$, the clock $CLK_A$ locates the eye center of the input data signal $D_{in}$. In the following, the phase difference corresponding to 0.5 UI between the clocks $CLK_A$ and $CLK_B$ is assumed to be 90 degrees.

The phase detector 3 detects a phase relationship between the input data signal $D_{in}$ and the clock $CLK_B$ according to the determination results $D_n$ and $E_n$. The phase relationship is detected as four states using four signals of U, D, S, and N, for example. For example, when the signal U is "1", it indicates the state where the phase of the clock $CLK_B$ is delayed with respect to the phase of the input data signal $D_{in}$, and, when the signal D is "1", it indicates the state where the phase of the clock $CLK_B$ is advanced with respect to the phase of the input data signal $D_{in}$. Here, when the signal S is "1", it indicates the state where the amplitude level of the input data signal $D_{in}$ does not make a transition. Further, when the signal N is "1", it indicates the state where the determination result $E_n$ has a different value from the determination result $D_n$ although the amplitude level of the input data signal $D_{in}$ does not make a transition, while this state does not appear basically in normal operation.

The phase adjuster 4A adjusts the phase of the clock $CLK_A$ according to the detection result of the phase detector 3A. Here, in the reception circuit 1 of the present embodiment, the filter 7 generates a phase code PHcode based on the signals U and D which are a part of the detection result, and the correction unit 5 corrects the phase code PHcode to generate the corrected phase code PScode and supplies the corrected phase code PScode to the phase adjuster 4A.

As described above, when the phase difference between the clocks $CLK_A$ and $CLK_B$ is set to 90 degrees which corresponds to 0.5 UI, and the clock $CLK_B$ follows the amplitude level transition point of the input data signal $D_{in}$, the clock $CLK_A$ is able to locate the eye center of the input data signal $D_{in}$. However, when the clocks $CLK_A$ and $CLK_B$ arrive at the determination units 2A and 2B, an error (skew) from the set phase difference is generated. Accordingly, the phase adjuster 4A uses the corrected phase code PScode which is obtained by the correction in the correction unit 5, and thereby performs phase adjustment so as to remove the skew.

Here, the clock $CLK_A$ is generated from a reference clock $CLK_{ref}$ which is supplied from an un-illustrated PLL (Phase Locked Loop) circuit or the like.

The phase adjuster 4B adjusts the phase of the clock $CLK_B$ so that the clock $CLK_B$ follows the amplitude level transition point (boundary) of the input data signal $D_{in}$, according to the detection result in the phase detector 3. Here, in the reception circuit 1 of the present embodiment, the phase adjuster 4B adjusts the phase of the clock $CLK_B$ according to the phase code PHcode which the filter 7 has generated based on the signals U and D which are a part of the detection result in the phase detector 3.

Here, also the clock $CLK_B$ is generated from the reference clock $CLK_{ref}$ which is supplied from the un-illustrated PLL circuit or the like.

The correction unit 5 corrects the skew generated between the clocks $CLK_A$ and $CLK_B$ which arrive at the determination units 2A and 2B from the phase adjusters 4A and 4B. In the reception circuit 1 of the present embodiment, the correction unit 5 is an adder, for example, and adds a shift code SDcode based on the correction amount determined in the correction amount determination unit 6 to the phase code PHcode to generate the corrected phase code PScode and supplies the corrected phase code PScode to the phase adjuster 4A.

The correction amount determination unit 6 determines the correction amount corresponding to the skew in the correction unit 5 according to the detection result in the phase detector 3 when the phase difference to be set (90 degrees) is made zero in the phase of the clock $CLK_A$. The correction amount determination unit 6 shifts the phase of the clock $CLK_A$ by 90 degrees close to the phase of the clock $CLK_B$ to set the phase difference to be set to zero. The correction amount is supplied to the correction unit 5 as the shift code SDcode. Further, the correction amount determination unit 6 releases the shift corresponding to the phase difference after the determination of the correction amount.

Here, in the determination of the correction amount, preferably the input data signal $D_{in}$ is not the data signal received by the reception circuit 1 but the data signal generated within the reception circuit 1 (hereinafter, called a test data signal). This is because the test data signal is generated in synchronization with the reference clock $CLK_{ref}$ and the clock $CLK_B$ is made to match the amplitude level transition point of the test data signal, and further the opening of an eye pattern is secured sufficiently and the correction amount is obtained accurately.

The signals U and D which are a part of the detection result of the phase detector 3 are supplied to the filter 7. The filter 7 generates and outputs the phase code PHcode in which high frequency components of the signals U and D are removed. As the filter 7, it is possible to use a digital filter, for example.

(Operation Example of the Reception Circuit 1)

In the following, an operation example will be explained for skew correction by the reception circuit 1.

The skew is generated due to the difference in the transmission path or the load between the clocks $CLK_A$ and $CLK_B$. For example, when DFE (Decision Feedback Equalizer) is used in the reception circuit 1, the number of determination units 2A increases because a plurality of threshold values is to be set for data determination. Accordingly, the load difference occurs between the clocks $CLK_A$ and $CLK_B$ to generate the skew.

The enclosed part on the left side of FIG. 1 illustrates an example of the generated skew. Before the skew correction, the phase of the clock $CLK_A$ is delayed in an amount larger by a skew A than the phase difference (90 degrees (corresponding to 0.5 UI)) which is set with respect to the clock $CLK_B$. Thereby, even when the edge of the clock $CLK_B$ follows the amplitude level transition point of the input data signal $D_{in}$, the edge of the clock $CLK_A$ is unable to locate the eye center of the input data signal $D_{in}$, and the accuracy of the data determination is deteriorated because of insufficient opening of the eye.

For correcting such a skew, the reception circuit 1 performs the following operation as initial operation or the like.

Here, the above-described test data signal is assumed to be used as the input data signal $D_{in}$ in the following.

First, the correction amount determination unit 6 shifts the clock $CLK_A$ to the transition point side close to the phase of the clock $CLK_B$ by the phase difference (0.5 UI) which is set between the clocks $CLK_A$ and $CLK_B$, using the shift code SDcode. That is, the phase difference to be set between the clocks $CLK_A$ and $CLK_B$ is made zero.

In the enclosed part on the right side of FIG. 1, edge positions of the clocks $CLK_A$ and $CLK_B$ are indicated by the arrows with respect to the input data signal $D_{in}$ for the cases before and after the phase shift and for the cases with and without the skew. The determination results $E_n$ and $D_n$ by the determination units 2A and 2B are obtained by the sampling at these edge positions.

When the skew does not exist, the edge of the clock $CLK_B$ is located at the amplitude level transition point of the input data signal $D_{in}$, and the edge of the clock $CLK_A$ is located at the eye center of the input data signal $D_{in}$. At this time, the determination result $E_n$ has a random value, and the determination result $D_n$ becomes 1 or 0 depending on the value of the input data signal $D_{in}$.

Here, when the correction amount determination unit 6 shifts the clock $CLK_A$ to the transition point side by 0.5 UI, also the edge of the clock $CLK_A$ is located at the amplitude level transition point of the input data signal $D_{in}$ as the edge of the clock $CLK_B$. At this time, the determination result $D_n$ of the determination unit 2A also becomes a random value as the determination result $E_n$.

On the other hand, when the skew exists, as described above, the edge of the clock $CLK_A$ is delayed in an amount larger by a skew amount A than the phase difference which is set with respect to the clock $CLK_B$. At this time, the determination result $D_n$ becomes 1 or 0 depending on the value of the input data signal $D_{in}$.

However, when the correction amount determination unit 6 shifts the clock $CLK_A$ to the transition point side by 0.5 UI, the edge of the clock $CLK_A$ is shifted from the transition point of the input data signal $D_{in}$ differently from the case without the skew. Accordingly, the determination result $D_n$ of the determination unit 2A does not become a random value but becomes the same value as in the case without the shift.

In this manner, the detection result in the phase detector 3 varies depending on the difference in the output of the determination unit 2A between the cases with and without the skew.

The correction amount determination unit 6 determines the correction amount according to the detection result in the phase detector 3 after the shift. For example, the correction amount determination unit 6 retains the detection result in the phase detector 3 after the shift when the skew does not exist as an appearance rate of the state where any of the above signals U, D, S, and N exhibits "1" (e.g., appearance rate of the state where the signal U exhibits "1"). Then, the correction amount determination unit 6 determines the correction amount by adjusting the shift code SDcode so that the appearance rate of some state becomes close to the retained appearance rate of this state.

Thereby, the edge of the clock $CLK_A$ moves in an arrow B direction in FIG. 1, and comes close to the amplitude level transition point of the input data signal $D_{in}$.

After the correction amount determination, the correction amount determination unit 6 releases the shift of 0.5 UI and fixes the shift code SDcode.

Thereby, as illustrated in the enclosed part of FIG. 1 on the left side, the phase of the clock $CLK_A$ which arrives at the determination unit 2A after the skew correction is adjusted so as to have an appropriate phase difference (90 degrees) with respect to the clock $CLK_B$.

Therefore, when the edge of the clock $CLK_B$ follows the amplitude level transition point of the input data signal $D_{in}$, the edge of the clock $CLK_A$ becomes able to locate the eye center of the input data signal $D_{in}$, and the data determination accuracy is improved. Further, resistance is improved against an external disturbance factor such as clock jitter.

Further, a dummy circuit needs not be disposed for delaying the phase of the clock $CLK_B$ in consideration of the skew, and therefore it is possible to suppress the increase of a circuit area and power consumption.

Second Embodiment

Figure 2:
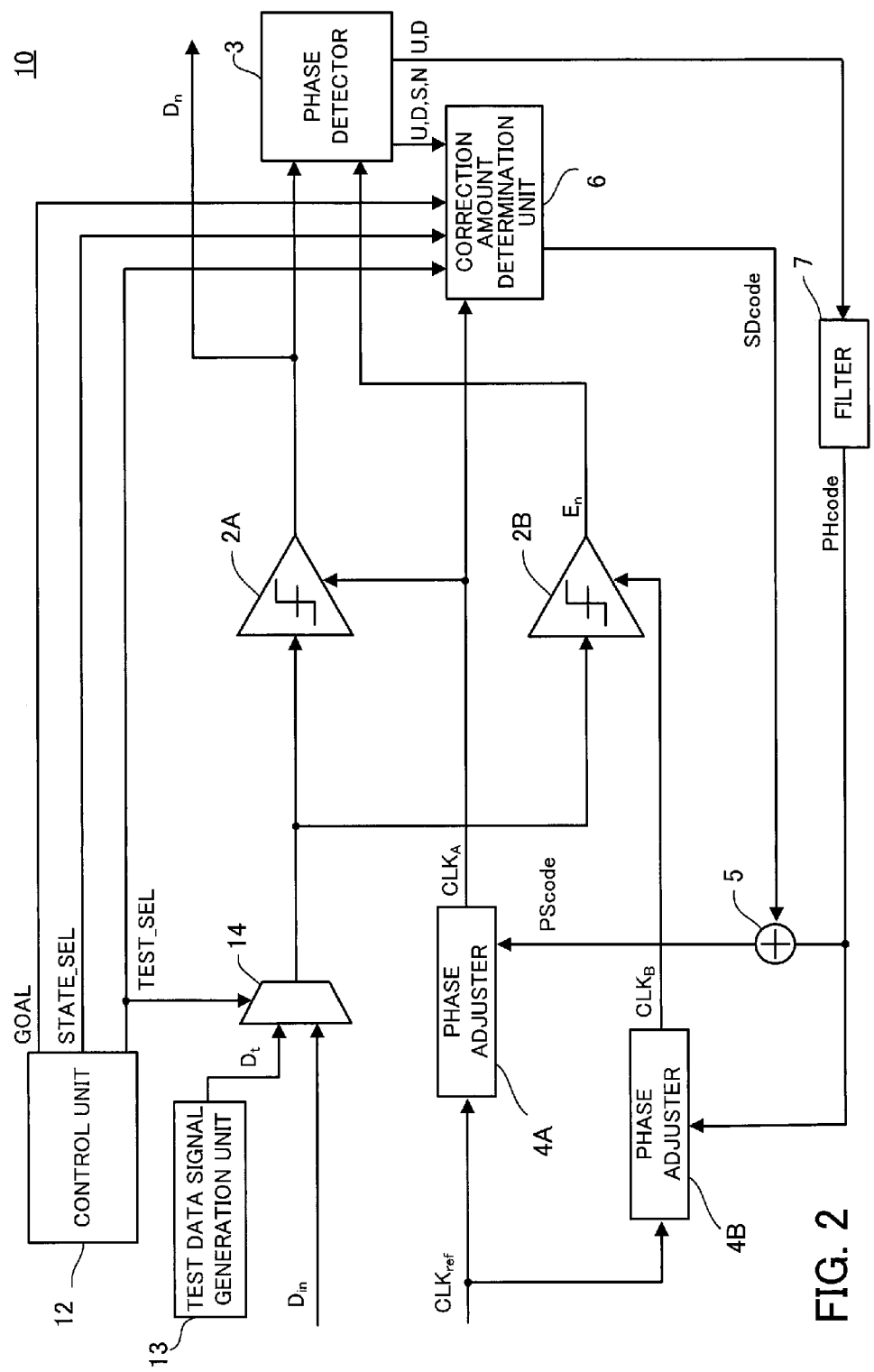
FIG. 2 illustrates an example of a reception circuit of a second embodiment.

FIG. 2 illustrates an example of a reception circuit of a second embodiment.

A reception circuit 10 has a function of 2×CDR as the reception circuit 1 of the first embodiment. Note that a like reference numeral refers to a like element of the reception circuit 1 illustrated in FIG. 1, and part of the explanation thereof will be omitted.

The reception circuit 10 includes determination units 2A and 2B, a phase detector 3, phase adjusters 4A and 4B, a correction unit 5, a filter 7, a correction amount determination unit 6, a control unit 12, a test data signal generation unit 13, and a selector 14.

The correction amount determination unit 6, while having the same function as the correction amount determination unit 6 in the reception circuit 1 of the first embodiment, operates according to selection signals TEST_SEL, and STATE_SEL, and a target value GOAL from the control unit 12. A circuit example and an operation example of the correction amount determination unit 6 will be described below.

The control unit 12 generates and outputs the selection signals TEST_SEL and STATE_SEL and the target value GOAL which are used when the correction amount determination unit 6 determines the skew correction amount.

The test data signal generation unit 13 generates a test data signal $D_t$ which synchronizes with the reference clock $CLK_{ref}$, for example. Here, when the data pattern of the test data signal $D_t$ is a repeated pattern of "0101...", the test data signal generation unit 13 may be an un-illustrated PLL circuit to generate the reference clock $CLK_{ref}$.

The selector 14 selects and outputs either the test data signal $D_t$ or the input data signal $D_{in}$ (reception data of the reception circuit 10) according to the selection signal TEST_SEL generated in the control unit 12. The selector 14 selects and outputs the test data signal $D_t$ when the determination operation of the skew correction amount is performed, and selects and outputs the input data signal $D_{in}$ when a normal operation is performed.

In the following, there will be explained an example of the phase adjusters 4A and 4B, the phase detector 3, and the correction amount determination unit 6 in the reception circuit 10.

(Example of the Phase Adjusters 4A and 4B)

Figure 3:
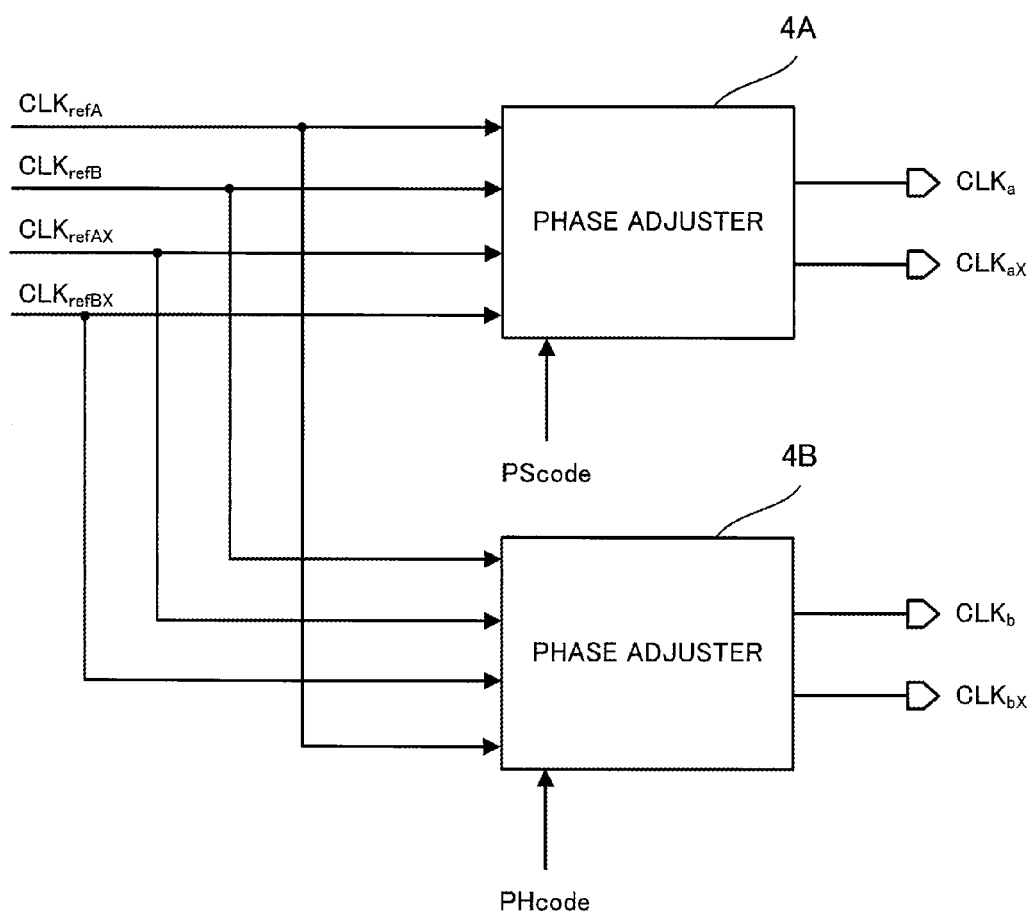
FIG. 3 illustrates an example of a relationship between a reference clock and a phase adjuster.

FIG. 3 illustrates an example of a relationship between the reference clock and the phase adjuster.

Reference clocks $CLK_{refA}$, $CLK_{refB}$, $CLK_{refAX}$, and $CLK_{refBX}$ are supplied to the phase adjusters 4A and 4B from the un-illustrated PLL circuit or the like as the reference clock $CLK_{ref}$ illustrated in FIG. 2. The reference clocks $CLK_{refA}$, $CLK_{refB}$, $CLK_{refAX}$, and $CLK_{refBX}$ have a predetermined phase relationship. The phase relationship is as follows, for example. That is, when the phase of the reference clock $CLK_{refA}$ has a reference phase (0 degrees), the reference clock $CLK_{refB}$ has a phase of 90 degrees, the reference clock $CLK_{refAX}$ has a phase of 180 degrees, and the reference clock $CLK_{refBX}$ has a phase of 270 degrees.

The phase adjuster 4A outputs clocks $CLK_a$ and $CLK_{aX}$ which are a differential signal phase-adjusted based on the corrected phase code PScode, the reference clocks $CLK_{refA}$, $CLK_{refB}$, $CLK_{refAX}$, and $CLK_{refBX}$, as the clock $CLK_A$ illustrated in FIG. 2.

The phase adjuster 4B outputs clocks $CLK_b$ and $CLK_{bX}$ which are a differential signal phase-adjusted based on the phase code PHcode, and the reference clocks $CLK_{refA}$, $CLK_{refB}$, $CLK_{refAX}$, and $CLK_{refBX}$, as the clock $CLK_B$ illustrated in FIG. 2.

Figure 4:
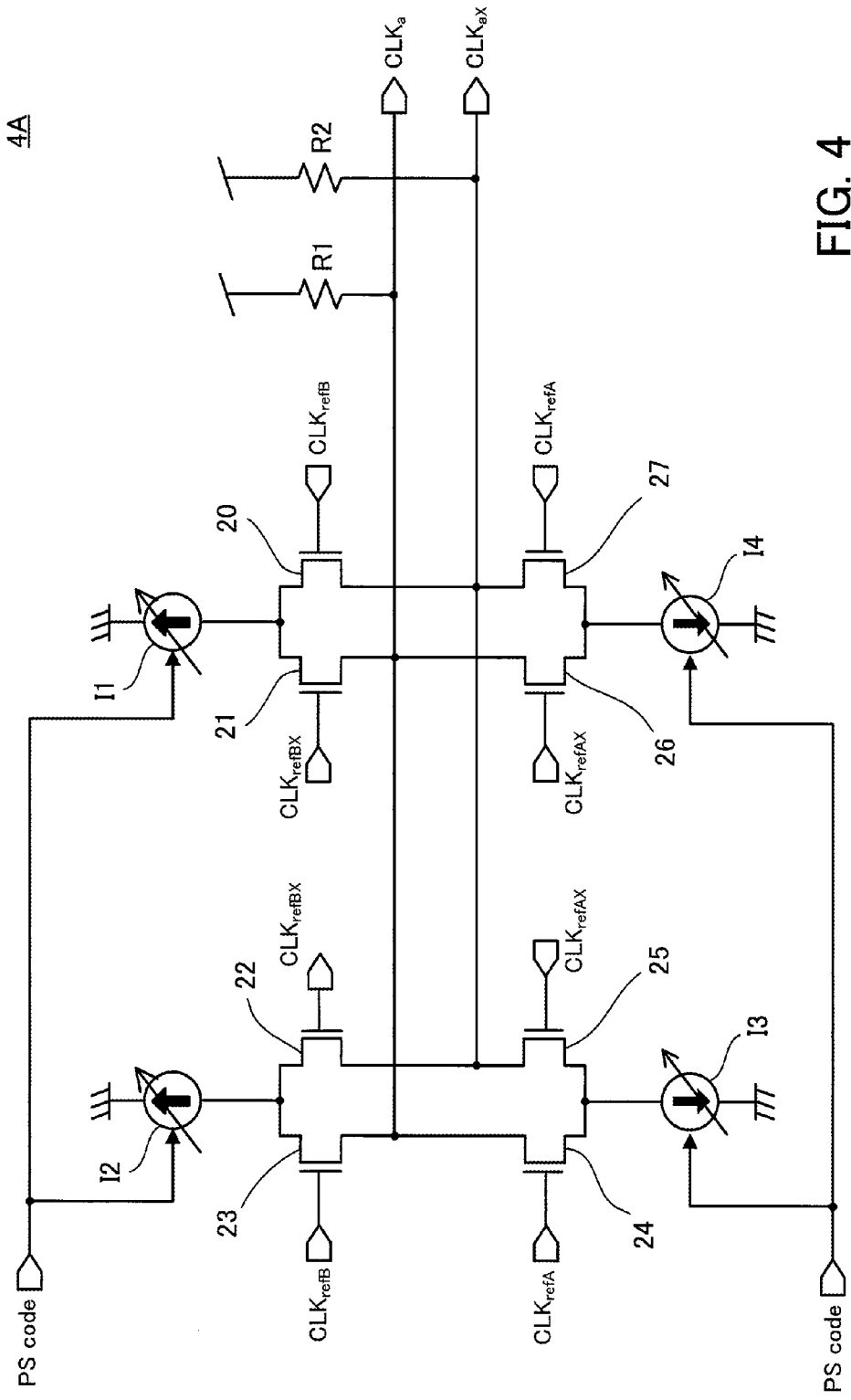
FIG. 4 illustrates an example of the phase adjuster.

FIG. 4 illustrates an example of the phase adjuster.

While an example of the phase adjuster 4A will be described in the following, the phase adjuster 4B may be realized also by the same circuit.

The phase adjuster 4A includes transistors 20, 21, 22, 23, 24, 25, 26, and 27, current sources I1, I2, I3, and I4, and resistors R1 and R2. In the example of FIG. 4, each of the transistors 20 to 27 is n-channel type MOSFET (Metal-Oxide Semiconductor Field Effect Transistor).

The reference clock $CLK_{refB}$ is input into the gate of the transistor 20, and the reference clock $CLK_{refBX}$ is input into the gate of the transistor 21. Further, the sources of the transistors 20 and 21 are connected to each other and grounded via the current source I1.

The reference clock $CLK_{refBX}$ is input into the gate of the transistor 22, and the reference clock $CLK_{refB}$ is input into the gate of the transistor 23. Further, the sources of the transistors 22 and 23 are connected to each other and grounded via the current source I2.

The reference clock $CLK_{refA}$ is input into the gate of the transistor 24, and the reference clock $CLK_{refAX}$ is input into the gate of the transistor 25. Further, the sources of the transistors 24 and 25 are connected to each other and grounded via the current source I3.

The reference clock $CLK_{refAX}$ is input into the gate of the transistor 26, and the reference clock $CLK_{refA}$ is input into the gate of the transistor 27. Further, the sources of the transistors 26 and 27 are connected to each other and grounded via the current source I4.

Further, the drains of the transistors 20, 22, 25, and 27 are connected to one another and connected to a power supply via the resistor R2. The drain voltage of the transistors 20, 22, 25, and 27 provides the clock $CLK_{aX}$.

On the other hand, the drains of the transistors 21, 23, 24, and 26 are connected to one another and connected to a power supply via the resistor R1. The drain voltage of the transistors 21, 23, 24, and 26 provides the clock $CLK_a$.

The current values of the current sources I1 to I4 are adjusted according to the corrected phase code PScode which is input into the phase adjuster 4A, and accordingly the phases of the clocks $CLK_a$ and $CLK_{aX}$ are adjusted.

Here, in the following, there will be explained the clock $CLK_a$ out of the clocks $CLK_a$ and $CLK_{aX}$ which are the differential signal, as the clock $CLK_A$ illustrated in FIG. 2.

The phase adjuster 4B has the same circuit as the phase adjuster 4A illustrated in FIG. 4. It is possible to realize the function of the phase adjuster 4B by exchanging the reference clocks $CLK_{refA}$, $CLK_{refB}$, $CLK_{refAX}$, and $CLK_{refBX}$ input into the gates of the transistors 20 to 27 in FIG. 4 and by adjusting the current values of the current sources I1 to I4 according to the phase code PHcode.

For example, while the reference clock $CLK_{refB}$ is input into the gates of the transistors 20 and 23 in the example of FIG. 4, the reference clock $CLK_{refAX}$ having a phase difference of 90 degrees with respect to the reference clock $CLK_{refB}$ is input in the phase adjuster 4B. Further, while the reference clock $CLK_{refBX}$ is input into the gates of the transistors 21 and 22 in the example of FIG. 4, the reference clock $CLK_{refA}$ having a phase difference of 90 degrees with respect to the reference clock $CLK_{refBX}$ is input in the phase adjuster 4B. Further, while the reference clock $CLK_{refA}$ is input into the gates of the transistors 24 and 27 in the example of FIG. 4, the reference clock $CLK_{refB}$ having a phase difference of 90 degrees with respect to the reference clock $CLK_{refA}$ is input in the phase adjuster 4B. Further, while the reference clock $CLK_{refAX}$ is input into the gates of the transistors 25 and 26 in the example of FIG. 4, the reference clock $CLK_{refBX}$ having a phase difference of 90 degrees with respect to the reference clock $CLK_{refAX}$ is input in the phase adjuster 4B.

Thereby, when the phase code PHcode and the corrected phase code PScode are the same, the clocks CLKA and CLKB output from the phase adjusters 4A and 4B have a phase difference of 90 degrees. Here, for the case that the skew is generated when the clocks CLKA and CLKB arrive at the determination units 2A and 2B, the corrected phase code PScode has a value different from the value of the phase code PHcode according to the shift code SDcode generated in the correction amount determination unit 6. In this case, the clocks CLKA and CLKB output from the phase adjusters 4A and 4B have a phase difference smaller than 90 degrees, for example.

(Example of the Phase Detector 3 and the Correction Amount Determination Unit 6)

Figure 5:
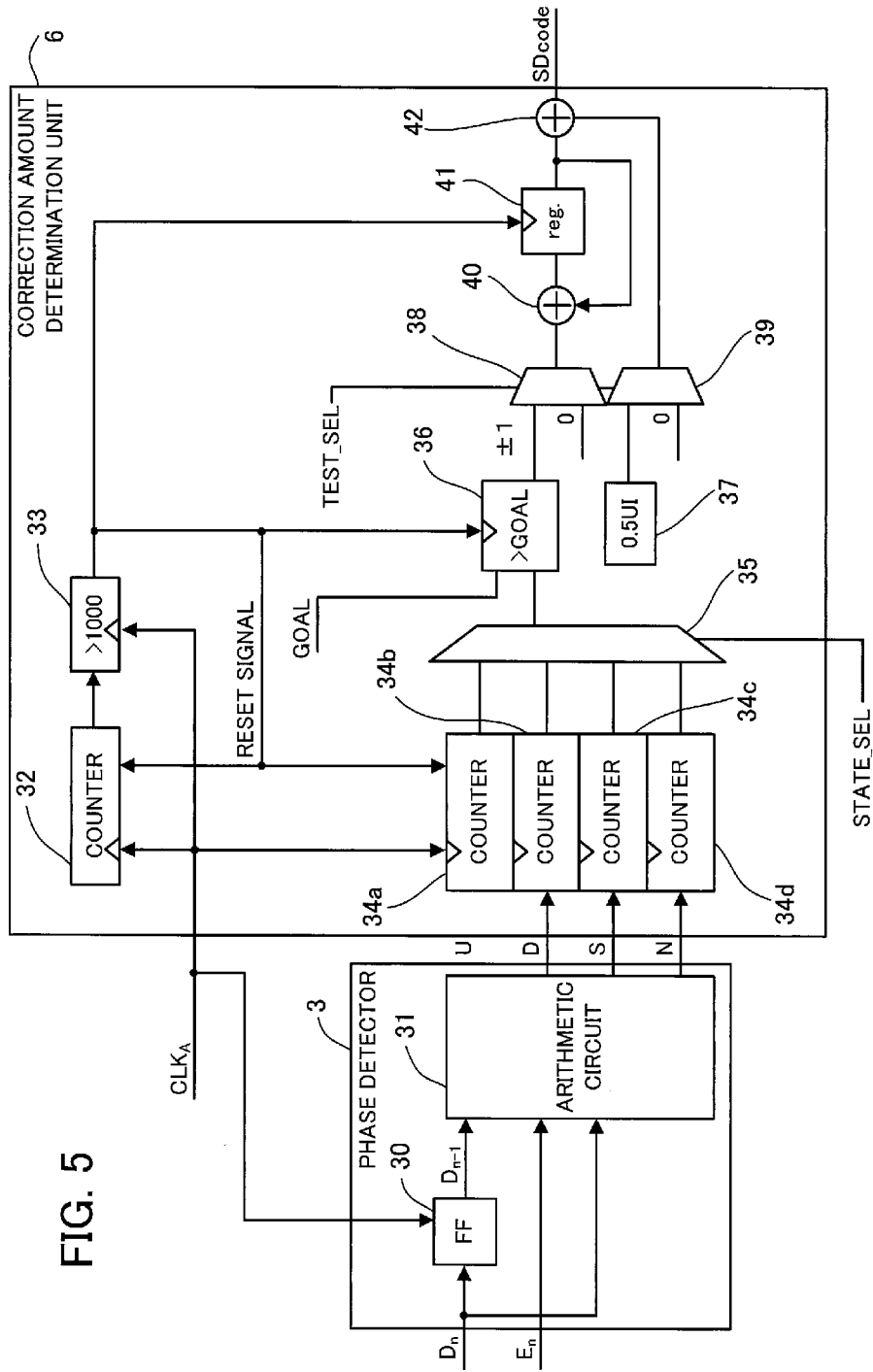
FIG. 5 illustrates an example of a phase detector and a correction amount determination unit.

FIG. 5 illustrates an example of the phase detector and the correction amount determination unit.

The phase detector 3 includes FF (Flip Flop) 30 and an arithmetic circuit 31. Further, the correction amount determination unit 6 includes a counter 32, a comparison circuit 33, counters 34a, 34b, 34c, and 34d, a selector 35, a comparison circuit 36, a register 37, selectors 38 and 39, an adder 40, a register 41, and an adder 42.

FF 30 retains the determination result $D_n$ of the determination unit 2A in synchronization with the clock $CLK_A$, and outputs the determination result $D_n$ as a 1-bit delayed determination result $D_{n-1}$.

The arithmetic circuit 31 performs operation of realizing the following truth table based on the determination result $D_n$, the determination result $D_{n-1}$ output from FF 30, and the determination result $E_n$ of the determination unit 2B, and outputs the signals U, D, S, and N as the above-described phase information.

FIG. 6 illustrates an example of the truth table realized by the arithmetic circuit.

The truth table illustrated in FIG. 6 describes four states of the signals U, D, S, and N which are outputs corresponding to the eight combinations of the values in the determination results $D_{n-1}$, $E_n$, and $D_n$. The four states include "Up", "Down", "Stay", and "N/A". An example for each of the states will be described in the following.

Figure 7:
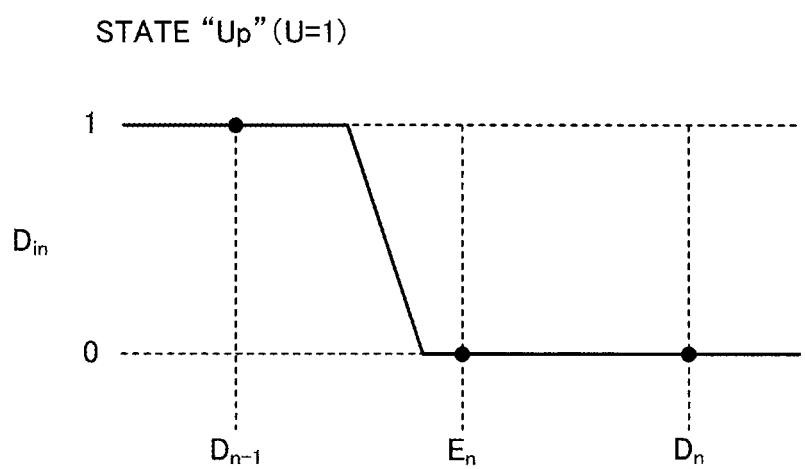
FIG. 7 illustrates an example of a state "Up"

FIG. 7 illustrates an example of the state "Up".

When the signal U exhibits "1", the state is "Up". The state "Up" is the state where the input data signal $D_{in}$ makes a transition and also the determination result $E_n$ has the same value as the determination result $D_n$. That is, the state "Up" indicates the state where the phase of the clock $CLK_B$ which is to follow the transition point is delayed with respect to the input data signal $D_{in}$. As illustrated in FIG. 7, the state becomes "Up" for the case of $(D_{n-1}, E_n, D_n)=(1, 0, 0)$ in the determination result when the input data signal $D_{in}$ makes a transition from "1" to "0".

Here, also when the input data signal $D_{in}$ makes a transition from "0" to "1", as in the truth table illustrated in FIG. 6, the state becomes "Up" for the case of $(D_{n-1}, E_n, D_n)=(0, 1, 1)$ in the determination result (i.e., case where the determination results $E_n$ and $D_n$ are the same).

Figure 8:
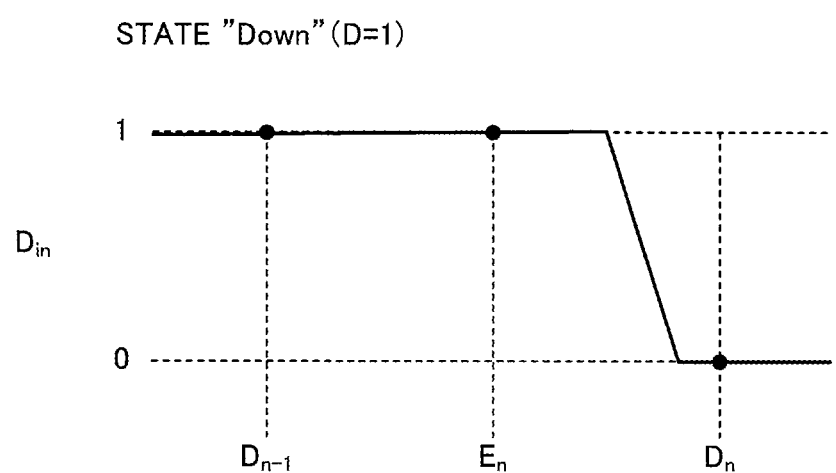
FIG. 8 illustrates an example of a state "Down"

FIG. 8 illustrates an example of the state "Down".

When the signal D exhibits "1", the state is "Down". The state "Down" is the state where the input data signal $D_{in}$ makes a transition and also the determination result $E_n$ has the same value as the determination result $D_{n-1}$. That is, the state "Down" indicates the state where the phase of the clock $CLK_B$ which is to follow the transition point is advanced with respect to the input data signal $D_{in}$. As illustrated in FIG. 8, the state becomes "Down" for the case of $(D_{n-1}, E_n, D_n)=(1, 1, 0)$ in the determination result when the input data signal $D_{in}$ makes a transition from "1" to "0".

Here, also when the input data signal $D_{in}$ makes a transition from "0" to "1", as in the truth table illustrated in FIG. 6, the state becomes "Down" for the case of $(D_{n-1}, E_n, D_n)=(0, 0, 1)$ in the determination result (i.e., case where the determination results $E_n$ and $D_{n-1}$ are the same value).

Figure 9:
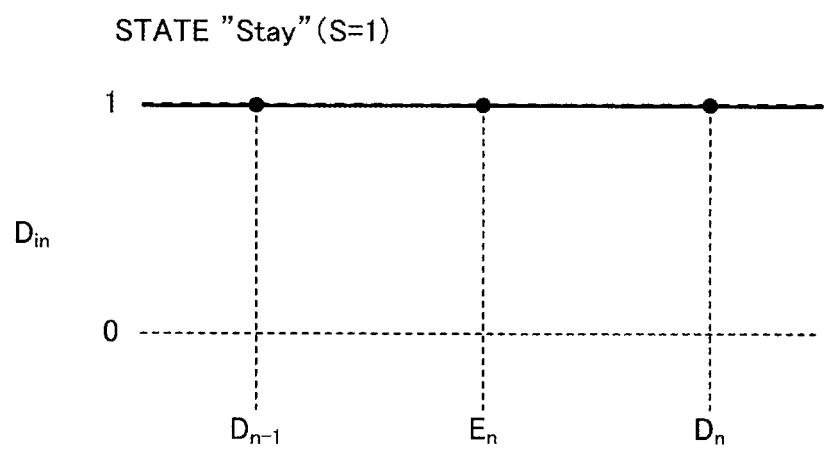
FIG. 9 illustrates an example of a state "Stay"

FIG. 9 illustrates an example of the state "Stay".

When the signal S exhibits "1", the state is "Stay". The state "Stay" is the state where the input data signal $D_{in}$ does not make a transition and also the determination results $E_n$, $D_{n-1}$, and $D_n$ have the same value.

As illustrated in FIG. 9, for the case of $(D_{n-1}, E_n, D_n)=(1, 1, 1)$ in the determination result when the input data signal $D_{in}$ keeps the state "1", the state becomes "Stay".

Here, also when the input data signal $D_{in}$ keeps the state "0", as in the truth table illustrated in FIG. 6, for the case of $(D_{n-1}, E_n, D_n)=(0, 0, 0)$ in the determination result, the state becomes "Stay".

Figure 10:
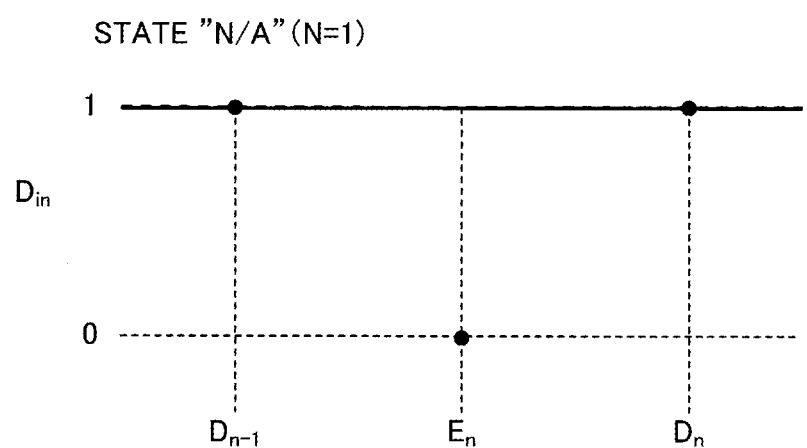
FIG. 10 illustrates an example of a state "N/A"

FIG. 10 illustrates an example of the state "N/A".

When the signal N exhibits "1", the state is "N/A" (also called glitch). The state "N/A" is the state where the value of the determination result $E_n$ is different from the values of the determination results $D_{n-1}$ and $D_n$ despite the state where the input data signal $D_{in}$ does not make a transition, and the state which does not appear basically in the normal operation.

As illustrated in FIG. 10, for the case of $(D_{n-1}, E_n, D_n)=(1, 0, 1)$ in the determination result when the input data signal $D_{in}$ keeps the state "1", the state becomes "N/A".

Here, also when the input data signal $D_{in}$ keeps the state "0", as in the truth table illustrated in FIG. 6, for the case of $(D_{n-1}, E_n, D_n)=(0, 1, 0)$ in the determination result, the state becomes "N/A".

Next, there will be explained the correction amount determination unit 6 illustrated in FIG. 5.

The counter 32 counts the number of clocks $CLK_A$ (e.g., number of rising edges) and outputs the count value. Further, the counter 32 resets the count value to zero on receiving a reset signal output from the comparison circuit 33.

The comparison circuit 33 compares the count value of the counter 32 and a predetermined value (1000 in the example of FIG. 5), and outputs the reset signal in synchronization with the rising edge of the clock $CLK_A$ when the count value reaches the predetermined value.

The counter 34a counts the value of the signal U output from the arithmetic circuit 31 in synchronization with the rising edge of the clock $CLK_A$. Further, the counter 34a resets the count value to zero on receiving the reset signal.

The counter 34b counts the value of the signal D output from the arithmetic circuit 31 in synchronization with the rising edge of the clock $CLK_A$. Further, the counter 34b resets the count value to zero on receiving the reset signal.

The counter 34c counts the value of the signal S output from the arithmetic circuit 31 in synchronization with the rising edge of the clock $CLK_A$. Further, the counter 34c resets the count value to zero on receiving the reset signal.

The counter 34d counts the value of the signal N output from the arithmetic circuit 31 in synchronization with the rising edge of the clock $CLK_A$. Further, the counter 34d resets the count value to zero on receiving the reset signal.

The selector 35 selects and outputs the count value in any of the signals U, D, S, and N output from the counters 34a to 34d based on the value of the selection signal STATE_SEL output from the control unit 12 illustrated in FIG. 2.

The comparison circuit 36 compares the target value GOAL output from the control unit 12 and an output from the selector 35 (count value in any of the signals U, D, S, and N) when the comparison circuit 33 outputs the reset signal, and outputs +1 or −1 according to the comparison result. The target value GOAL is set based on the appearance rate of a specific state (any of "Up", "Down", "Stay", and "N/A") for the case without the skew. A setting example of the target value GOAL will be described below.

The register 37 stores a value to be added to the shift code SDcode for shifting the clock $CLK_A$ by 0.5 UI.

The selector 38 outputs either the output of the comparison circuit 36 or "0" according to the selection signal TEST_SEL. When the skew correction amount is determined, the output (±1) from the comparison circuit 36 is selected and output, and, after the correction amount determination (in the normal operation), "0" is selected and output.

The selector 39 outputs either the value of the register 37 or "0" according to the selection signal TEST_SEL. When the skew correction amount is determined, the value of the register 37 is selected and output, and after the correction amount determination (in the normal operation), "0" is selected and output.

The adder 40 adds the output of the selector 38 (±1 or 0) to the value retained in the register 41.

The register 41 retains the output value of the adder 40 at the timing when the rest signal is issued. The initial value of the register 41 is zero.

The adder 42 adds the output value of the register 41 and the output value of the selector 39, and outputs the result as the shift code SDcode.

In the following, there will be explained an example of the skew correction operation by the reception circuit 10 of the second embodiment.

(Example of Skew Correction Operation)

Figure 11:
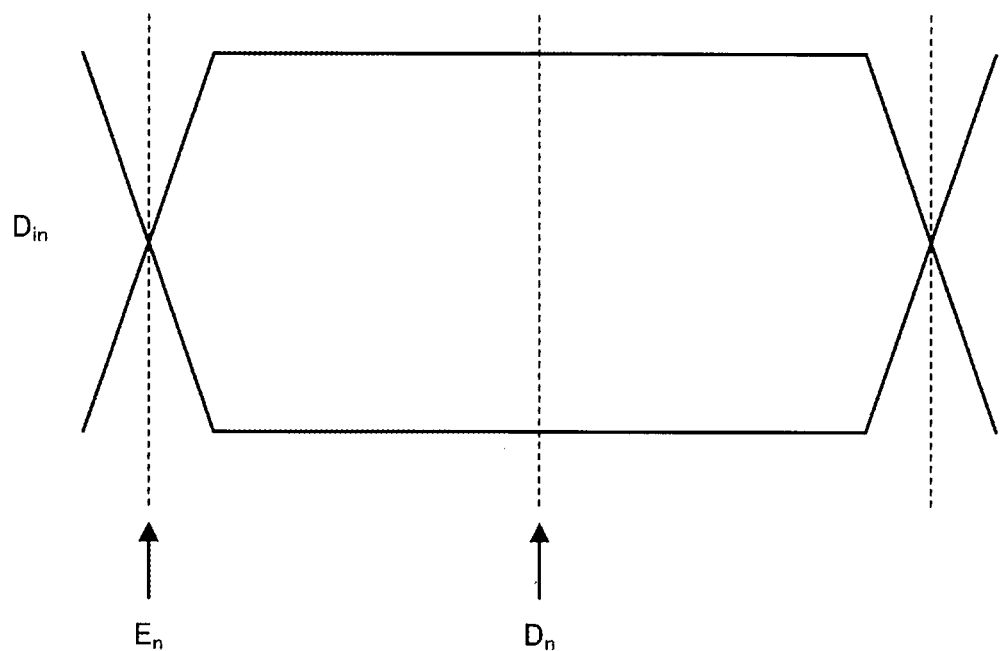
FIG. 11 illustrates an example of edge positions of clocks $CLK_A$ and $CLK_B$ when a skew does not exist.

FIG. 11 illustrates an example of the edge positions of the clocks $CLK_A$ and $CLK_B$ when the skew does not exist.

Figure 12:
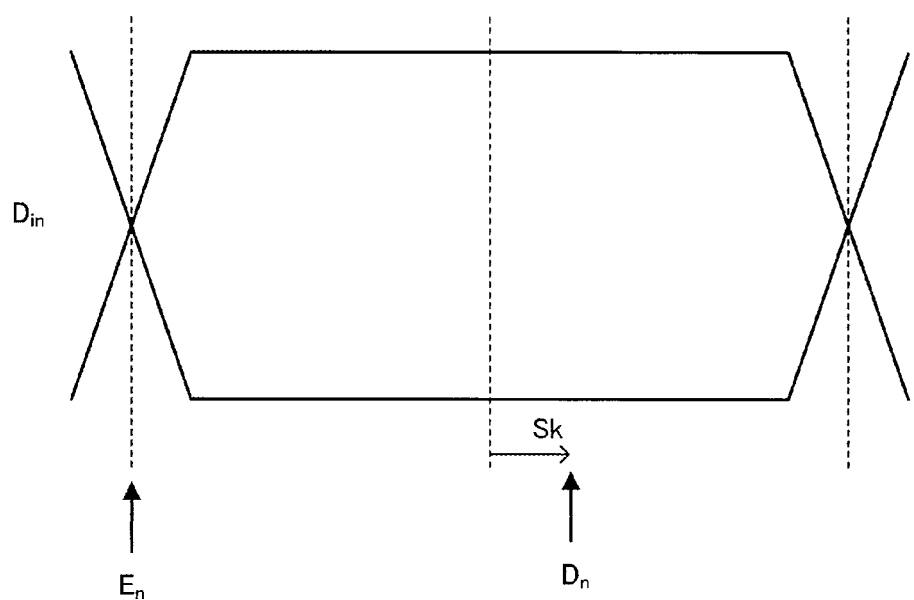
FIG. 12 illustrates an example of edge positions of clocks $CLK_A$ and $CLK_B$ when a skew exists.

Further, FIG. 12 illustrates an example of the edge positions of the clocks $CLK_A$ and $CLK_B$ when the skew exists.

In FIG. 11 and FIG. 12, the edge positions of the clocks $CLK_A$ and $CLK_B$ are indicated by the arrows with respect to the input data signal $D_{in}$ when the skew exists and does not exist. The determination results $E_n$ and $D_n$ in the determination units 2A and 2B are obtained by the sampling at these edge positions.

When the skew does not exist, and the phase difference set between the clocks $CLK_A$ and $CLK_B$ is 90 degrees, as illustrated in FIG. 11, the edge of the clock $CLK_B$ is located at the transition point of the input data signal $D_{in}$ and the edge of the clock $CLK_A$ is located at the eye center of the input data signal $D_{in}$.

On the other hand, when the skew exists, the edge of the clock $CLK_A$ is delayed in an amount larger by a skew Sk than the phase difference of 90 degrees which is set with respect to the clock $CLK_B$.

The input data signal $D_{in}$ is data received from another IC chip or the like via a transmission line. Accordingly, for a high transmission speed (transmission rate) and a long transmission line, sometimes the waveform of the input data signal $D_{in}$ is deteriorated and the opening of the eye pattern becomes small. In such a case, when the skew exists, as illustrated in FIG. 12, the determination result $D_n$ is obtained at the phase shifted from the eye center and thus an error value is sometimes sampled.

Accordingly, the reception circuit 10 performs the following operation for suppressing such a skew.

The control unit 12 illustrated in FIG. 2 sets the selection signal TEST_SEL to "1", for example. At this time, the selector 14 selects and outputs the test data signal $D_t$ which is output from the test data signal generation unit 13. By using the test data signal $D_t$ generated within the reception circuit 10, it is possible to synchronize the test data signal $D_t$ with the reference clock $CLK_{ref}$ and to match the clock $CLK_B$ with the amplitude level transition point of the test data signal $D_t$. Further, since the test data signal $D_t$ provides a sufficiently large eye pattern opening compared with the received input data signal $D_{in}$, the correction amount is able to be obtained accurately.

Further, in the correction amount determination unit 11, the selector 38 illustrated in FIG. 5 selects and outputs the output of the comparison circuit 36, and the selector 39 selects and outputs the value stored in the register 37.

First, the phase of the clock $CLK_A$ is shifted by 0.5 UI by the shift code SDcode generated at this time, and comes close to the phase of the clock $CLK_B$.

The determination results $D_{n-1}$, $E_n$, and $D_n$ which are obtained by the determination units 2A and 2B at the sampling timing by the shifted clock $CLK_A$ and the clock $CLK_B$ are input into the arithmetic circuit 31 (FIG. 5) of the phase detector 3. The arithmetic circuit 31 outputs the signals U to N which describe the phase relationships between the test data signal $D_t$ and the clock $CLK_B$ by the four states based on the truth table illustrated in FIG. 6.

Figure 13:
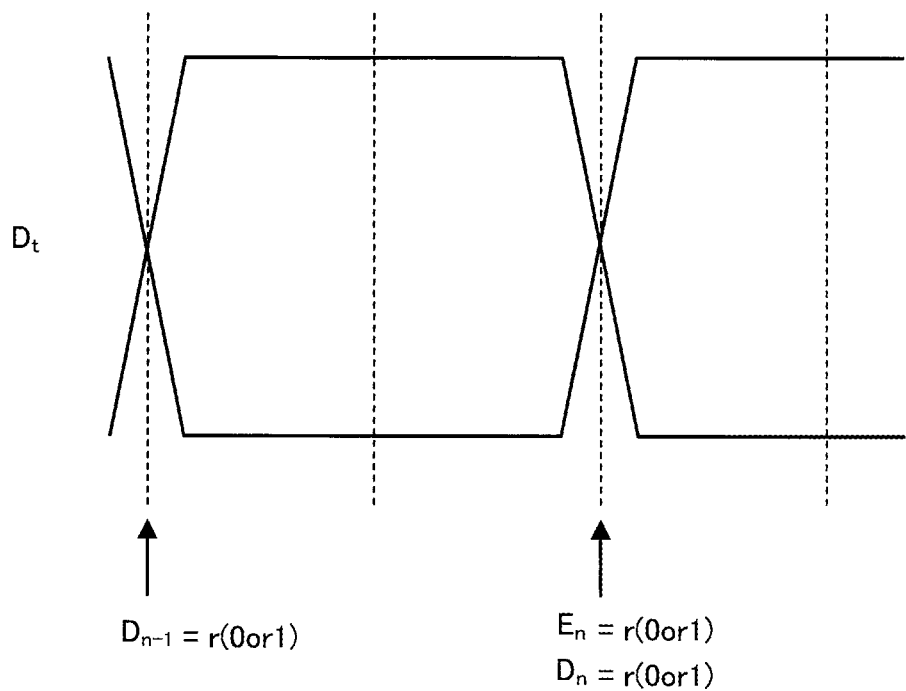
FIG. 13 illustrates an example of edge positions of clocks $CLK_A$ and $CLK_B$ after phase shift when a skew does not exist.

FIG. 13 illustrates an example of the edge positions of the clocks $CLK_A$ and $CLK_B$ after the phase shift and the values of the determination results when the skew does not exist.

FIG. 13 illustrates the edge positions of the clocks $CLK_A$ and $CLK_B$ indicated by the arrows with respect to the test data signal $D_t$. Further, FIG. 13 illustrates the values of the determination results $E_n$, $D_{n-1}$, and $D_n$ by the determination units 2A and 2B at these edge positions. Here, the data pattern of the test data signal $D_t$ is assumed to be "0101 . . . ".

For the case where the skew does not exist, when the phase of the clock $CLK_A$ is shifted by 0.5 UI, any of the determination results $D_{n-1}$, $E_n$, and $D_n$ has a value determined at the amplitude level transition point of the test data signal $D_t$. At the transition point, each of the determination results $D_{n-1}$, $E_n$, and $D_n$ has a random value (expressed by "r" in FIG. 13) of 0 or 1 because of the influence of the external disturbance such as the clock jitter.

At this time, there is a possibility that all the four states "Stay", "Down", "N/A", and "Up" in the truth table illustrated in FIG. 6 appear, and the appearance rate in each of the states becomes 25%.

Figure 14:
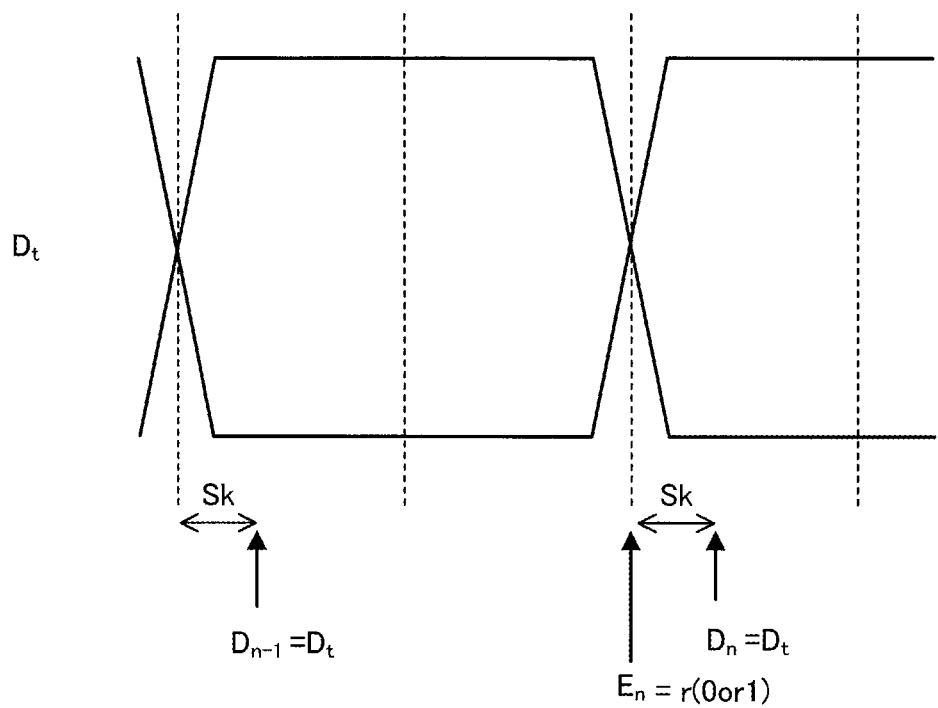
FIG. 14 illustrates an example of edge positions of clocks $CLK_A$ and $CLK_B$ after phase shift when a skew exists.

FIG. 14 illustrates an example of the edge positions of the clocks $CLK_A$ and $CLK_B$ after the phase shift and the values of the determination results when the skew exists.

FIG. 14 illustrates the edge positions of the clocks $CLK_A$ and $CLK_B$ indicated by the arrows with respect to the test data signal $D_t$. Further, FIG. 14 illustrates the values of the determination results $E_n$, $D_{n-1}$, and $D_n$ by the determination units 2A and 2B at these edge positions. Here, the data pattern of the test data signal $D_t$ is also assumed to be "0101 . . . ".

For the case where the skew Sk exists, also when the phase of the clock $CLK_A$ is shifted by 0.5 UI, the determination results $D_{n-1}$ and $D_n$ become values determined at time points shifted by the skew Sk from the amplitude level transition point of the test data signal $D_t$. That is, the determination results $D_{n-1}$ and $D_n$ have the value of the test data signal $D_t$ at these time points (sampling timing).

At this time, since the data pattern of the test data signal $D_t$ is "0101 . . . ", states appearing among the four states in the truth table illustrated in FIG. 6 are two states of "Up" and "Down", and the appearance rate in each of the states becomes 50%.

As described above, the appearance rate in each of the states is different depending on whether the skew exist or not.

In the reception circuit 10 of the present embodiment, the correction amount determination unit 11 determines the correction amount so that the appearance rate of a state obtained in the phase detector 3 when the skew is generated becomes close to the appearance rate of the state when the skew does not exist.

The control unit 12 supplies the target value GOAL which corresponds to the appearance rate of a specific state when the skew does not exist, to the correction amount determination unit 11. The target value GOAL is a value obtained by multiplying the appearance rate of the specific state when the skew does not exist by a predetermined value (e.g., 1000).

For the appearance rate in each of the states, a different value is set depending on the data pattern of the test data signal $D_t$. In the following, there will be explained a setting example of the target value GOAL when the data pattern is "0011".

Figure 15:
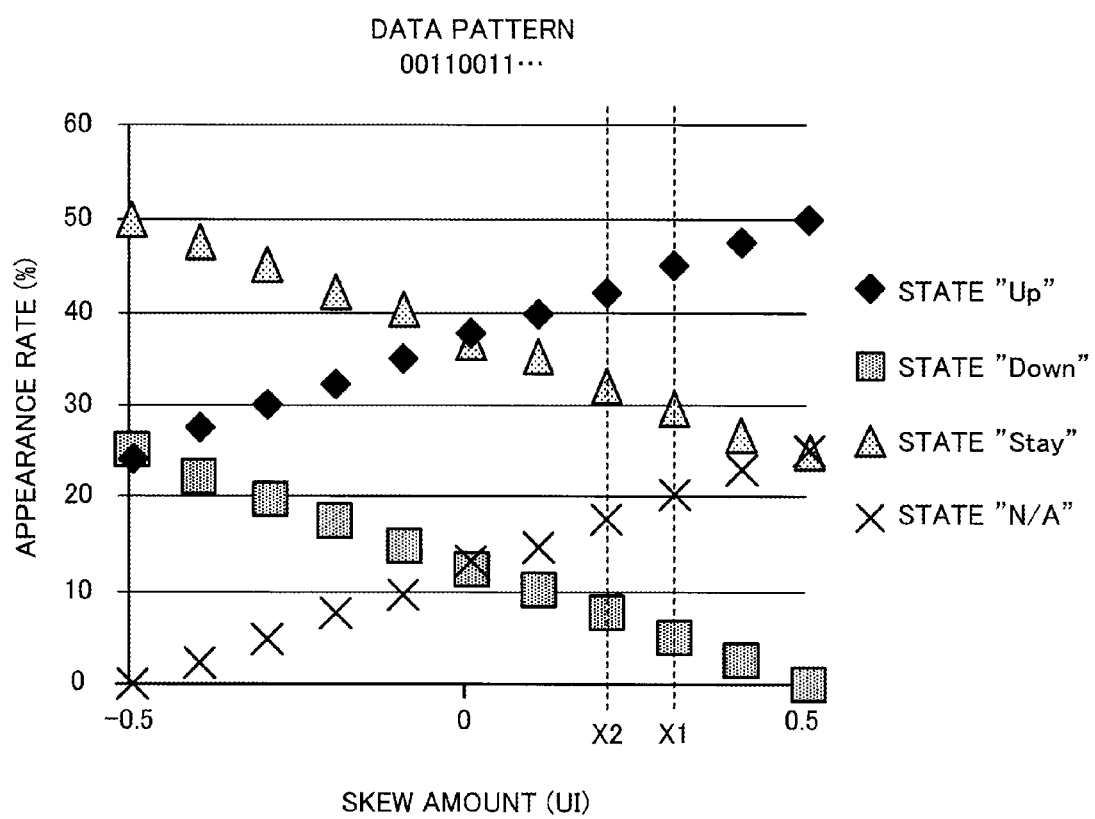
FIG. 15 illustrates an example of a relationship between a skew amount and an appearance rate of each state when a data pattern is "00110011 . . . "

FIG. 15 illustrates an example of a relationship between a skew amount and the appearance rate in each of the states when the data pattern is "00110011 . . . "

The horizontal axis indicates the skew amount (UI), and the vertical axis indicates the appearance rate (%). The plots having four kinds of shape indicate the relationships between the appearance rates of the four states and the skew amount.

When the target value GOAL is determined based on the appearance rate of the state "Down" when the skew does not exist, since the appearance rate of the state "Down" when the skew amount is zero is 12.5%, the target value GOAL is obtained by multiplying this appearance rate by the above predetermined value. For example, when the predetermined value is 1000, the target value GOAL is obtained as 0.125× 1000=125.

When the target value GOAL is set in this manner, the correction amount determination unit 6 determines the correction amount by the following processing.

In the correction amount determination unit 6 illustrated in FIG. 5, when the count value of the counter 32 reaches a predetermined value (assumed to be 1000, also in the following), the comparison circuit 36 compares the target value GOAL with the output of the selector 35.

When the target value GOAL is 125 which corresponds to the appearance rate of the state "Down" when the skew does not exist, the control unit 12 causes the selector 35 to select the count value of the counter 34*b* which counts the value of the signal D, using the selection signal STATE_SEL.

When the count value of the counter 32 has reached 1000, if the count value of the counter 34*b* is 50, for example, it means that the appearance rate of the state "Down" is 5%. At this time, as illustrated in FIG. 15, the skew amount has a value larger than zero (e.g., X1).

When the count value of the counter 34*b* is smaller than the target value GOAL as above, the comparison circuit 36 outputs −1 for reducing the skew amount. When the correction amount is determined, the selector 38 selects the output of the comparison circuit 36, and thereby −1 is stored in the register 41 (the initial value of the register 41 is zero) and the value of the shift code SDcode is reduced by 1.

Thereby, the corrected phase code PScode output from the correction unit 5 is also reduced by one, and the phase adjuster 4A performs the adjustment of advancing the phase of the clock $CLK_A$.

The skew amount is reduced by the processing like this. For example, when the count value of the counter 32 has reached 1000 next, if the count value of the counter 34*b* is approximately 75, for example, it means that the appearance rate of the state "Down" is approximately 7.5%. At this time, the skew amount is still larger than zero (e.g., X2) as illustrated in FIG. 15.

Also at this time, the output of the comparison circuit 36 exhibits −1 and is added to the value of the register 41 (−1) in the adder 40, and the stored value in the register 41 becomes −2. Further, the value of the shift code SDcode is reduced further by 1, and the phase adjuster 4A performs the adjustment of further advancing the phase of the clock $CLK_A$.

The correction amount determination unit 6 repeats the above processing until the count value of the counter 34*b* become the same as the target value GOAL. When the count value of the counter 34*b* becomes the same as the target value GOAL, the value retained in the register 41 becomes the correction amount to be applied to the normal operation.

While omitted from the illustration, the control unit 12 detects the count value of the counter 34 which is output from the selector 35, for example. Then, when detecting that the count value has become the same as the target value GOAL, the control unit 12 causes the selectors 38 and 39 to output zero using the selection signal TEST_SEL. Thereby, the shift of 0.5 UI for the clock $CLK_A$ is released, and the value retained in the register 41 (correction amount) is output as the shift code SDcode. Further, the control unit 12 causes the selector 14 (FIG. 2) to output the input data signal $D_{in}$ using the selection signal TEST_SEL.

The correction unit 5 corrects the phase code PHcode using the shift code SDcode, and generates the corrected phase code PScode and supplies the corrected phase code PScode to the phase adjuster 4A. Thereby, the phase adjuster 4A performs the phase adjustment for the clock $CLK_A$ in consideration of the skew. Accordingly, the skew generated when the clocks $CLK_A$ and $CLK_B$ arrive at the determination units 2A and 2B is suppressed.

Here, while, in the above example, the termination condition of the correction amount determination processing is configured to be that the count value of the counter 34*b* becomes the same as the target value GOAL, the termination condition is not limited to this case. For example, that the count value of the counter 34*b* falls within a certain range from the target value GOAL may be the termination condition.

Further, while, in the above, the example of determining the correction amount is explained using the count value of the counter 34*b* corresponding to the appearance rate of the state "Down", the example is not limited to this case. The correction amount may be determined by the use of the count value of the counter 34*a*, 34*c*, or 34*d* which corresponds to the appearance rate of another state "Up", "Stay", or "N/A".

Further, the data pattern of the test data signal $D_t$ is not limited to "00110011 . . . ". In the following, setting examples of the target value GOAL will be explained for the data pattern of "0101 . . . " and a random data pattern.

Figure 16:
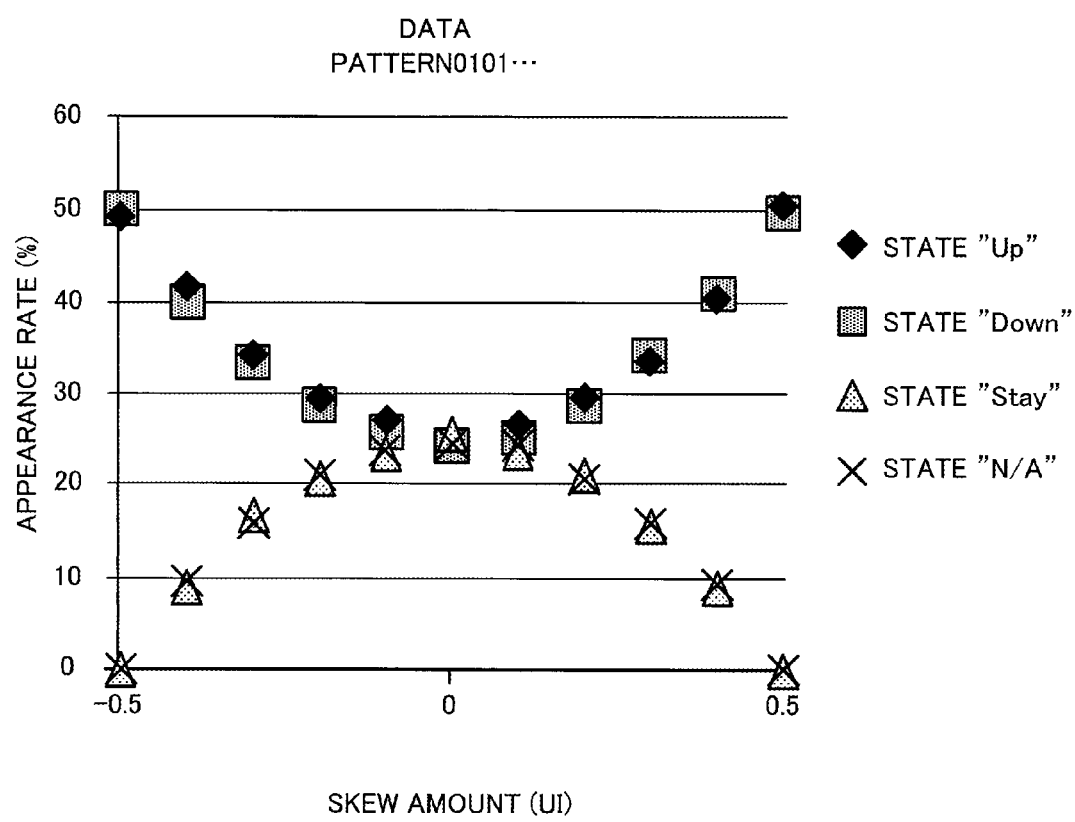
FIG. 16 illustrates an example of a relationship between a skew amount and an appearance rate of each state when a data pattern is "0101 . . . "

FIG. 16 illustrates an example of a relationship between the skew amount and the appearance rate in each of the states when the data pattern is "0101 . . . ".

The horizontal axis indicates the skew amount (UI), and the vertical axis indicates the appearance rate (%). The plots having the four kinds of shape indicate relationships between the appearance rates of the four states and the skew amount.

When the target value GOAL is determined based on the appearance rate of the state "Down" for the case without the skew, since the appearance rate of the state "Down" when the skew amount is zero is 25%, the target value GOAL is obtained by multiplying this appearance rate by the above predetermined value. For example, when the predetermined value is 1000, the target value GOAL is obtained as 0.25× 1000=250.

Figure 17:
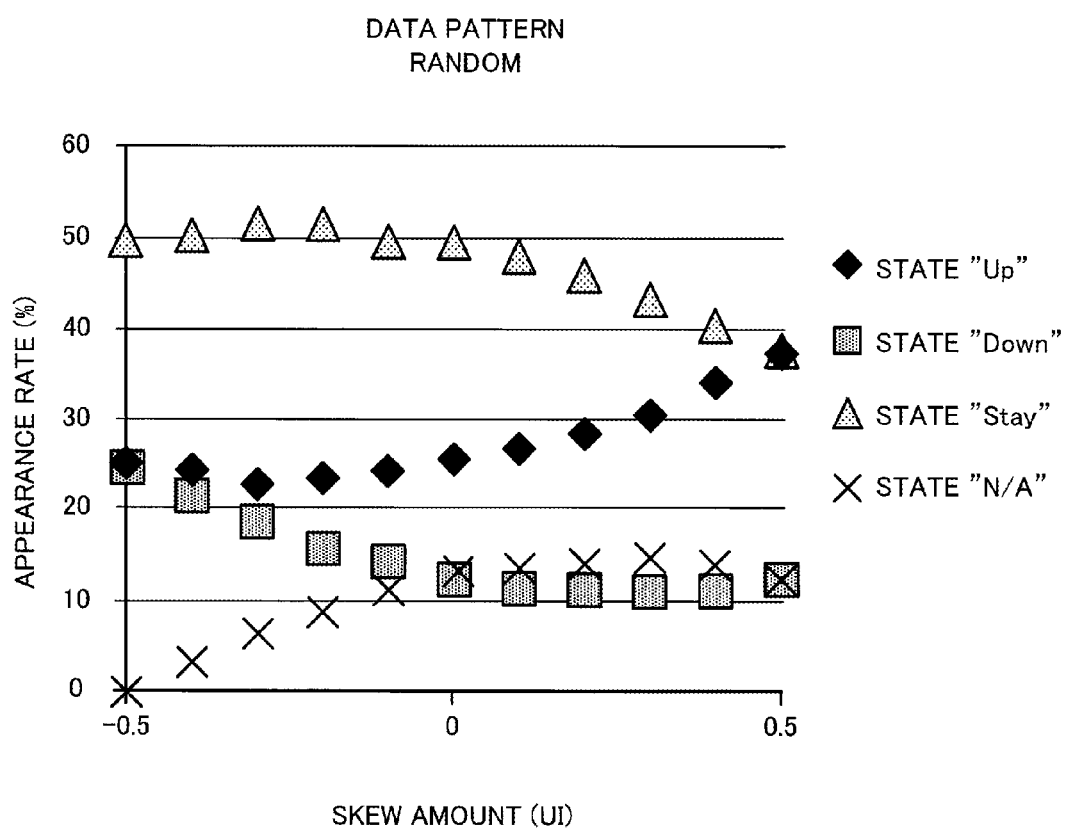
FIG. 17 illustrates an example of a relationship between a skew amount and an appearance rate of each state when a data pattern is random.

FIG. 17 illustrates an example of a relationship between the skew amount and the appearance rate in each of the states for the random data pattern.

The horizontal axis indicates the skew amount (UI), and the vertical axis indicates the appearance rate (%). The plots having the four kinds of shape indicate relationships between the appearance rates of the four states and the skew amount.

When the target value GOAL is determined based on the appearance rate of the state "Down" for the case without the skew, since the appearance rate of the state "Down" when the skew amount is zero is approximately 12%, the target value GOAL is obtained by multiplying this appearance rate by the above predetermined value. For example, when the predetermined value is 1000, the target value GOAL is obtained as 0.12×1000=120.

In this manner, since a value (target value GOAL) corresponding to the appearance rate of a specific state when the skew does not exist is set depending on the data pattern, it is possible to determine the correction value using various data patterns.

As described above, in the reception circuit 10 of the present embodiment, the correction amount is determined so that the appearance rate in any of the four states according to the signals U, D, S, and N generated in the phase detector 3 when the phase of the clock $CLK_A$ is shifted by 0.5 UI, becomes close to the appearance rate for the case without the skew.

The phase adjuster 4A performs the phase adjustment of the clock $CLK_A$ based on the correction amount, and the skew generated when the clocks $CLK_A$ and $CLK_B$ arrive at the determination units 2A and 2B is suppressed. Accordingly, when the edge of the clock $CLK_B$ follows the transition point of the input data signal $D_{in}$, the edge of the clock $CLK_A$ is able to locate the eye center of the input data signal $D_{in}$ and the data determination accuracy is improved. Further, a high resistance is obtained for the external disturbance factor such as the clock jitter.

Further, since a dummy circuit needs not be disposed for delaying the phase of the clock CLKB in consideration of the skew, it is possible to suppress the increase of the circuit area and the power consumption. Furthermore, since the correction amount determination unit 6 may be realized by a digital circuit, a high speed and high accuracy analog circuit needs not be used and therefore the circuit overhead is small.

(Variation Example)

Figure 18:
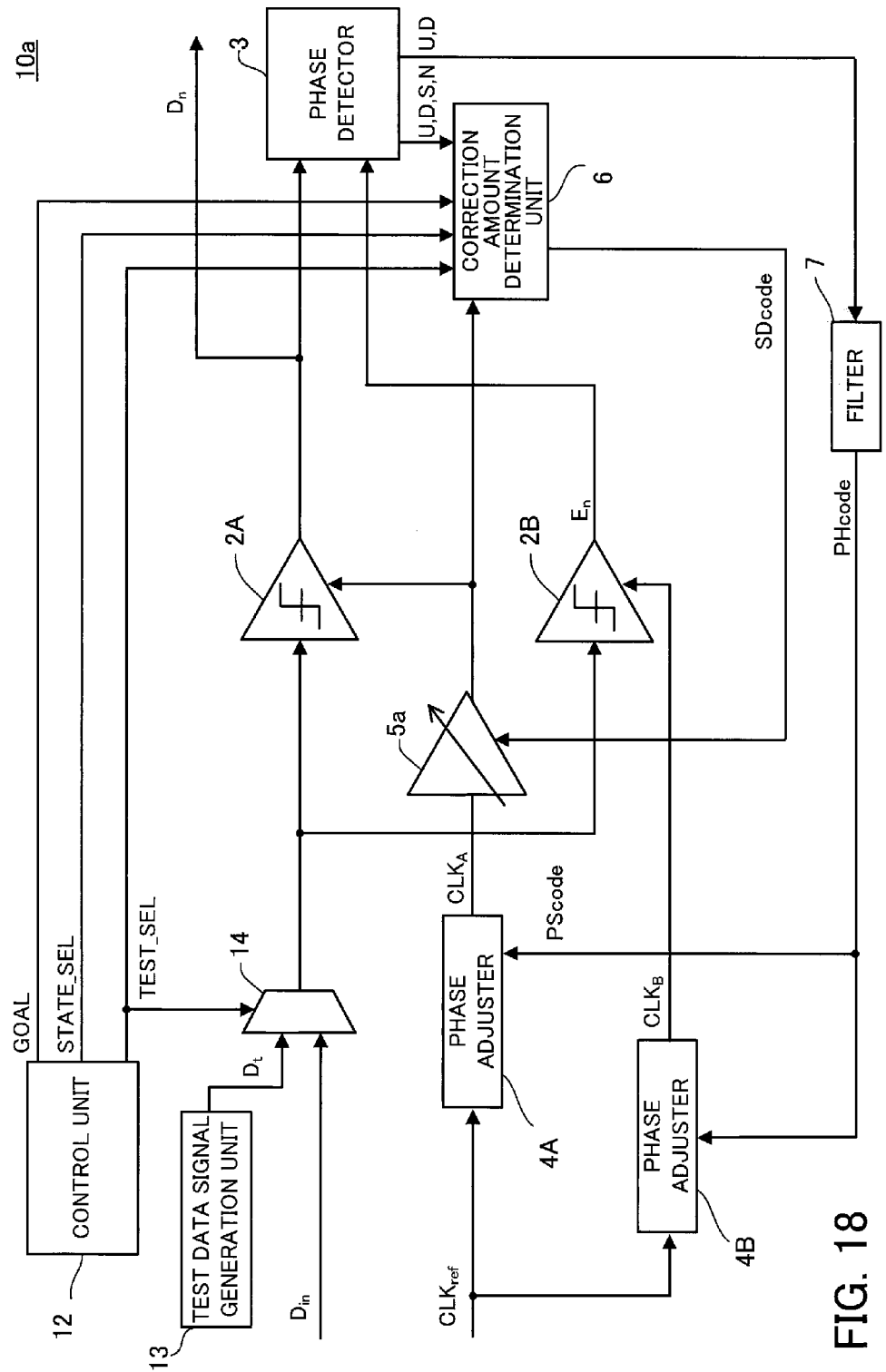
FIG. 18 illustrates a variation example of a reception circuit of a second embodiment.

FIG. 18 illustrates a variation example of the reception circuit of the second embodiment. Here, a like reference numeral refers to a like element of the reception circuit 10 illustrated in FIG. 2, and the explanation thereof will be omitted.

In a reception circuit 10a, a correction unit 5a corrects the skew generated between the clocks CLKA and CLKB which arrive at the determination units 2A and 2B from the phase adjusters 4A and 4B, and suppresses the variation of the phase difference which is set between the clocks CLKA and CLKB. The correction unit 5a, however, is different from the correction unit 5 illustrated in FIG. 2, and is a variable delay circuit, for example. The correction unit 5a adjusts the delay amount of the clock CLKA output from the phase adjuster 4A according to the shift code SDcode generated in the correction amount determination unit 6 by the above-described method, and supplies the adjusted delay amount to the determination unit 2A and the correction amount determination unit 6.

Also in the reception circuit 10a like this, the correction unit 5a corrects (suppresses) the skew generated between the clocks $CLK_A$ and $CLK_B$ according to the shift code SDcode, and thereby it is possible to obtain the effect of improving the data determination accuracy as in the reception circuit 10.

Third Embodiment

Figure 19:
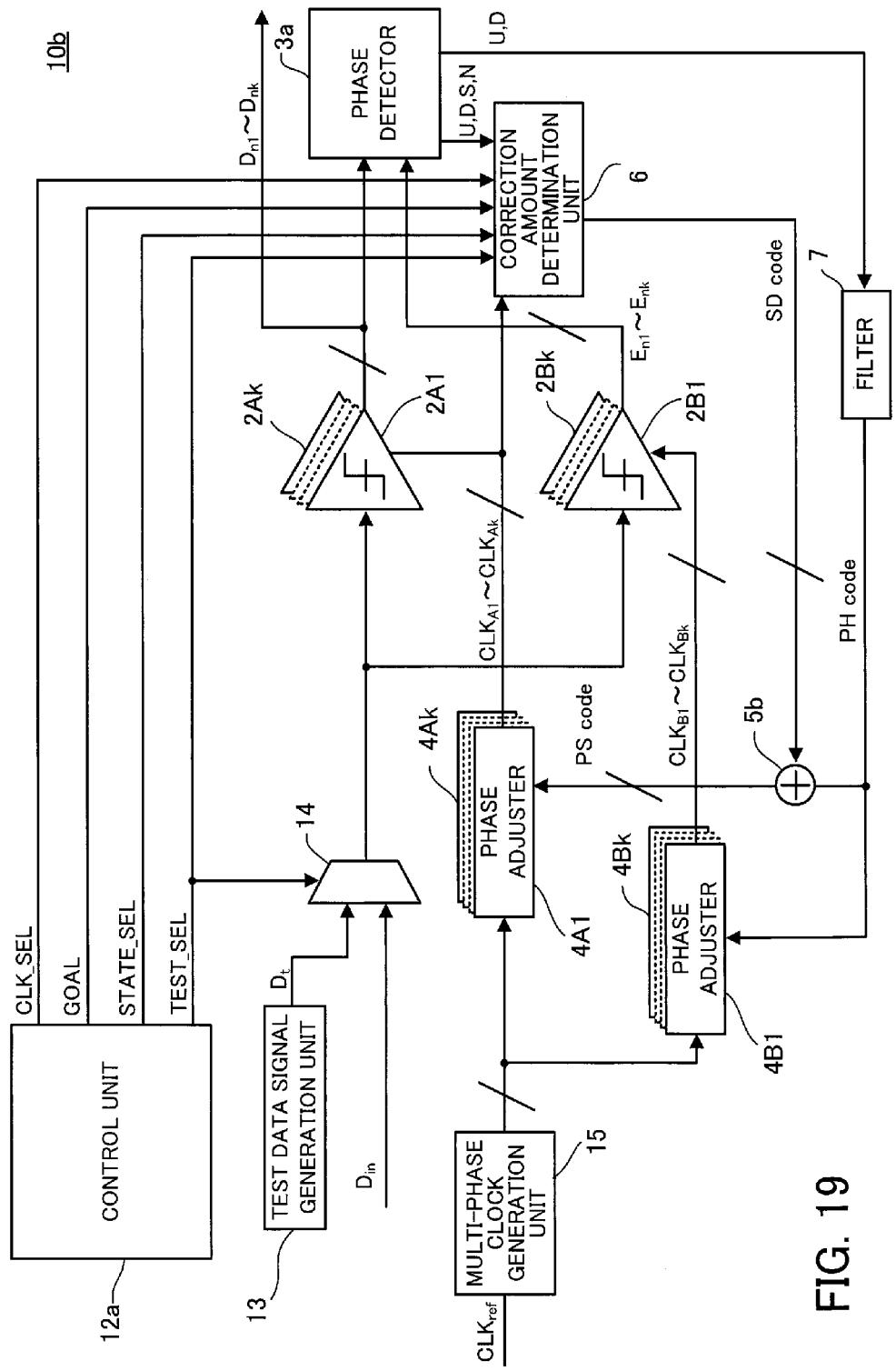
FIG. 19 illustrates an example of a reception circuit of a third embodiment.

FIG. 19 illustrates an example of a reception circuit of a third embodiment.

A like reference numeral refers to a like element of the reception circuit 10 illustrated in FIG. 2, and the explanation thereof will be omitted.

A reception circuit 10b according to the third embodiment is configured to be able to perform interleave operation using k clocks $CLK_{A1}$ to $CLK_{Ak}$ and $CLK_{B1}$ to $CLK_{Bk}$. Also when the frequency of the input data signal $D_{in}$ is high, operation using a low frequency clock is possible by parallel processing. Accordingly, it is possible to reduce the power consumption of the reception circuit 10b.

The reception circuit 10b includes determination units 2A1 to 2Ak and 2B1 to 2Bk, a phase detector 3a, phase adjusters 4A1 to 4Ak and 4B1 to 4Bk, a correction unit 5b, a filter 7, a correction amount determination unit 6, a control unit 12a, a test data signal generation unit 13, and a selector 14. The reception circuit 10b further includes a multi-phase clock generation unit 15.

In the reception circuit 10b like this, the multi-phase clock generation unit 15 generates k clocks having different phases according to the reference clock $CLK_{ref}$ supplied from an un-illustrated PLL circuit or the like.

The phase adjusters 4A1 to 4Ak adjust the phases of the respective k clock signals generated in the multi-phase clock generation unit 15 according to the corrected phase code PScode which is supplied from the correction unit 5b, and outputs the clocks $CLK_{A1}$ to $CLK_{Ak}$.

The phase adjusters 4B1 to 4Bk adjust the phases of the respective k clock signals generated in the multi-phase clock generation unit 15 according to the phase code PHcode which is supplied from the filter 7, and outputs the clocks $CLK_{B1}$ to $CLK_{Bk}$.

The determination units 2A1 to 2Ak determine the amplitude level of the input data signal $D_{in}$ or the test data signal $D_t$ in synchronization with the respectively corresponding clocks $CLK_{A1}$ to $CLK_{Ak}$. Then, the determination units 2A1 to 2Ak output the respective determination results $D_{n1}$ to $D_{nk}$.

The determination units 2B1 to 2Bk determine the amplitude level of the input data signal $D_{in}$ or the test data signal $D_t$ in synchronization with the respectively corresponding clocks $CLK_{B1}$ to $CLK_{Bk}$. Then, the determination units 2B1 to 2Bk output the respective determination results $E_{n1}$ to $E_{nk}$.

The phase detector 3a generates phase information indicating relationships between the phase of the input data signal $D_{in}$ or the test data signal $D_t$ and the clocks $CLK_{B1}$ to $CLK_{Bk}$ according to the determination results $D_{n1}$ to $D_{nk}$ and $E_{n1}$ to $E_{nk}$.

The correction amount determination unit 6, while having the same function as the correction amount determination unit 6 in the reception circuit 10 of the second embodiment, operates according to a clock selection signal CLK_SEL other than the selection signals TEST_SEL and STATE_SEL, and the target value GOAL from the control unit 12. A circuit example and an operation example of the correction amount determination unit 6 will be described below.

The control unit 12a generates and outputs the clock selection signal CLK_SEL for selecting the clock which determines the skew correction amount, other than the selection signals TEST_SEL and STATE_SEL and the target value GOAL which are used by the correction amount determination unit 6 to determine the skew correction amount.

(Example of Phase Detector 3a and Correction Amount Determination Unit 6)

Figure 20:
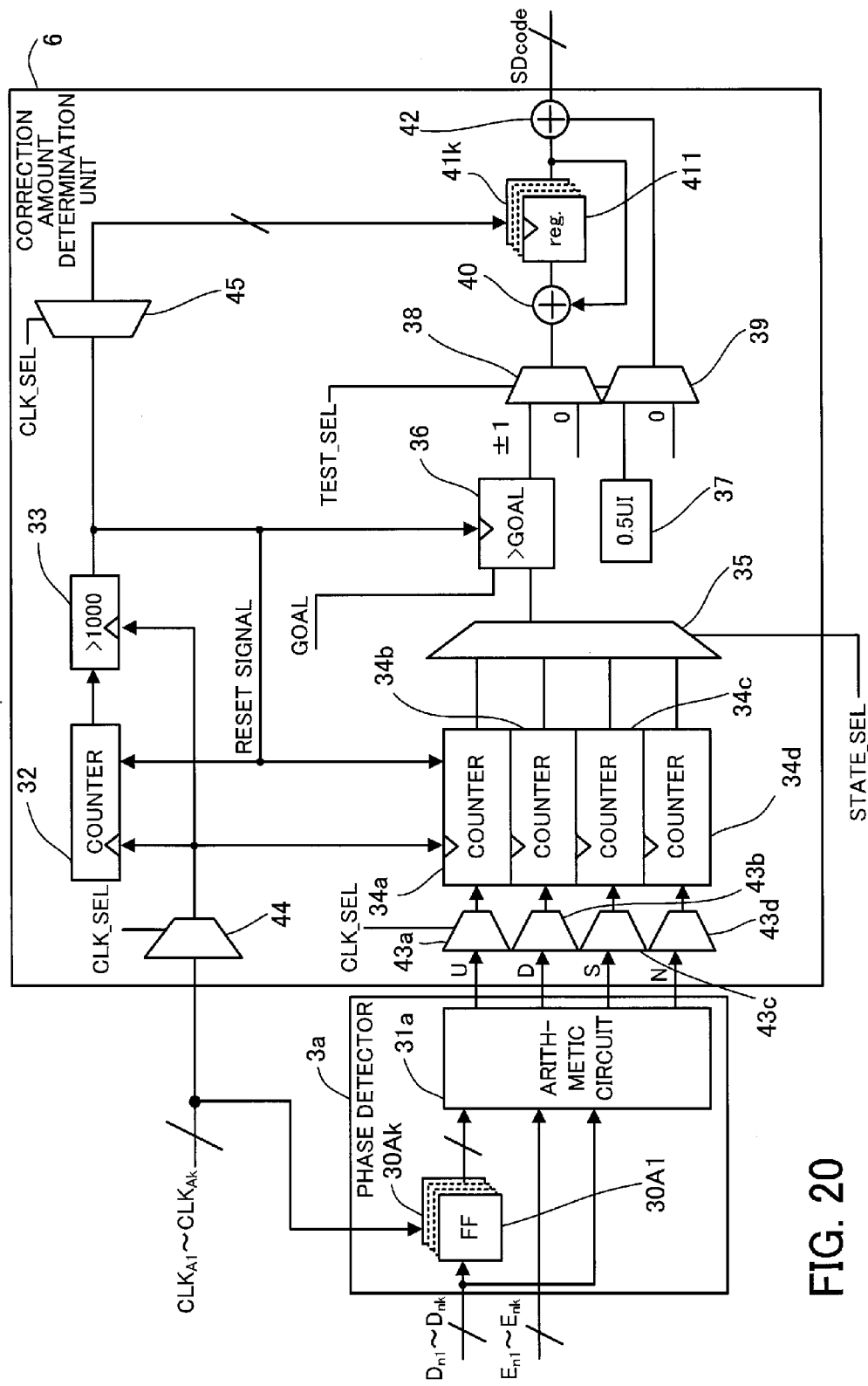
FIG. 20 illustrates an example of the phase detector and the correction amount determination unit.

FIG. 20 illustrates an example of the phase detector and the correction amount determination unit.

Here, a like reference numeral refers to a like element of the phase detector 3 and the correction amount determination unit 6 illustrated in FIG. 5, and the explanation thereof will be omitted.

The phase detector 3a includes k FFs 30A1 to 30Ak, and an arithmetic circuit 31a.

FFs 30A1 to 30Ak retain the determination results $D_{n1}$ to $D_{nk}$ of the determination units 2A1 to 2Ak in synchronization with the corresponding clocks $CLK_{A1}$ to $CLK_{Ak}$, and output the determination results $D_{n1}$ to $D_{nk}$ with the delay corresponding to 1 bit.

The arithmetic circuit 31a performs the operation of realizing the above-described truth table according to the determination results $D_{n1}$ to $D_{nk}$, the outputs of FFs 30A1 to 30Ak, and the determination results $E_{n1}$ to $E_{nk}$ in the determination units 2B1 to 2Bk. Then, the arithmetic circuit 31a outputs the signals U, D, S, and N as the information corresponding to the respective clocks $CLK_{A1}$ to $CLK_{Ak}$ (and clocks $CLK_{B1}$ to $CLK_{Bk}$).

The correction amount determination unit 6 includes a counter 32, a comparison circuit 33, counters 34a, 34b, 34c, and 34d, a selector 35, a comparison circuit 36, a register 37, selectors 38 and 39, an adder 40, and k registers 411 to 41k. Further, the correction amount determination unit 6 includes an adder 42, and selectors 43a, 43b, 43c, 43d, 44, and 45.

The selectors 43a to 43d select the signals U to N corresponding to any of the clocks $CLK_{A1}$ to $CLK_{Ak}$ according to the clock selection signal CLK_SEL, and output the signals U to N to the counters 34a to 34d, respectively.

The selector 44 selects the clock used for obtaining the above-described correction amount among the clocks $CLK_{A1}$ to $CLK_{Ak}$ according to the clock selection signal CLK_SEL.

The selector 45 outputs the reset signal supplied from the comparison circuit 36 to any of the registers 411 to 41k which store the correction amounts respectively corresponding to the clocks $CLK_{A1}$ to $CLK_{Ak}$, according to the clock selection signal CLK_SEL.

With the configuration as above, it is possible to set the independent shift codes SDcode (correction amounts) for the respective k clocks $CLK_{A1}$ to $CLK_{Ak}$.

The other operation is the same as that of the reception circuit 10 of the second embodiment, and it is possible to obtain the same effect as that of the reception circuit 10 of the second embodiment.

According to the disclosed reception circuit, it is possible to improve the data determination accuracy.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A reception circuit, comprising:
a first determination unit configured to determine a first amplitude level of an input data signal in synchronization with a first clock;
a second determination unit configured to determine a second amplitude level of the input data signal in synchronization with a second clock which has a first phase difference with respect to the first clock;
a phase detector configured to detect a phase relationship between the input data signal and the second clock based on the first amplitude level and the second amplitude level;
a first phase adjuster configured to adjust a phase of the first clock according to a detection result of the phase detector;
a second phase adjuster configured to adjust a phase of the second clock so that the second clock follow an amplitude level transition point of the input data signal according to the detection result;
a correction unit configured to correct a skew generated between the first clock and the second clock which arrive at the first determination unit and the second determination unit; and
a correction amount determination unit configured to determine a correction amount corresponding to the skew in the correction unit according to the detection result when the first phase difference is set to zero.

2. The reception circuit according to claim 1, wherein
the phase detector detects a plurality of states indicating a plurality of phase relationships, and
the correction amount determination unit selects a first state among the plurality of states and adjusts the correction amount so that an appearance rate of the first state comes close to an appearance rate of the first state when the skew does not exist.

3. The reception circuit according to claim 2, further comprising
a selector configured to select a test data signal generated in the reception circuit instead of the input data signal, and supply the test data signal to the first determination unit and the second determination unit, when the correction amount is determined.

4. The reception circuit according to claim 3, wherein
a different value is set depending on a data pattern of the test data signal as the appearance rate of the first state when the skew does not exist.

* * * * *